(12) United States Patent
Cheng et al.

(10) Patent No.: US 9,085,455 B2
(45) Date of Patent: Jul. 21, 2015

(54) MEMS DEVICES AND METHODS FOR FORMING SAME

(71) Applicant: Taiwan Semiconductor Manufacturing Company, Ltd., Hsin-Chu (TW)

(72) Inventors: Chun-Wen Cheng, Zhubei (TW); Chia-Hua Chu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/893,058

(22) Filed: May 13, 2013

(65) Prior Publication Data

US 2014/0264661 A1   Sep. 18, 2014

Related U.S. Application Data

(60) Provisional application No. 61/782,168, filed on Mar. 14, 2013.

(51) Int. Cl.
  *B81C 3/00* (2006.01)
  *B81B 7/00* (2006.01)

(52) U.S. Cl.
  CPC ............... *B81C 3/001* (2013.01); *B81B 7/0032* (2013.01)

(58) Field of Classification Search
  CPC ............ F16H 61/0251; F16K 99/0001; F16K 99/0011; F16K 99/0059; F16D 2048/0209; H01L 2924/00; H01L 2924/1461; H01L 2924/00014; H01L 2224/48091; H01L 2924/0002; H01L 23/02; B81C 3/001; B81C 7/0032
  USPC .......................... 257/417, 415, 414, 420, 723
  See application file for complete search history.

(56) References Cited

U.S. PATENT DOCUMENTS

| | | | |
|---|---|---|---|
| 8,350,346 B1 * | 1/2013 | Huang et al. | 257/415 |
| 8,513,747 B1 | 8/2013 | Huang et al. | |
| 2007/0231943 A1 | 10/2007 | Ouellet et al. | |
| 2011/0121412 A1 | 5/2011 | Quevy et al. | |
| 2012/0038372 A1 | 2/2012 | Reinmuth et al. | |
| 2012/0043627 A1 | 2/2012 | Lin et al. | |
| 2012/0261774 A1 | 10/2012 | Graham et al. | |
| 2012/0326248 A1 * | 12/2012 | Daneman et al. | 257/415 |
| 2013/0334620 A1 | 12/2013 | Chu et al. | |
| 2014/0042562 A1 | 2/2014 | Chu et al. | |
| 2014/0264648 A1 | 9/2014 | Chu et al. | |
| 2014/0264653 A1 | 9/2014 | Cheng et al. | |
| 2014/0264662 A1 | 9/2014 | Cheng et al. | |

FOREIGN PATENT DOCUMENTS

WO     2012122872 A1     9/2012

* cited by examiner

*Primary Examiner* — Chuong A Luu
*Assistant Examiner* — Rodolfo Fortich
(74) *Attorney, Agent, or Firm* — Slater & Matsil, L.L.P.

(57) ABSTRACT

Embodiments of the present disclosure include MEMS devices and methods for forming MEMS devices. An embodiment is a method for forming a microelectromechanical system (MEMS) device, the method including forming a MEMS wafer having a first cavity, the first cavity having a first pressure, and bonding a carrier wafer to a first side of the MEMS wafer, the bonding forming a second cavity, the second cavity having a second pressure, the second pressure being greater than the first pressure. The method further includes bonding a cap wafer to a second side of the MEMS wafer, the second side being opposite the first side, the bonding forming a third cavity, the third cavity having a third pressure, the third pressure being greater than the first pressure and less than the second pressure.

21 Claims, 18 Drawing Sheets

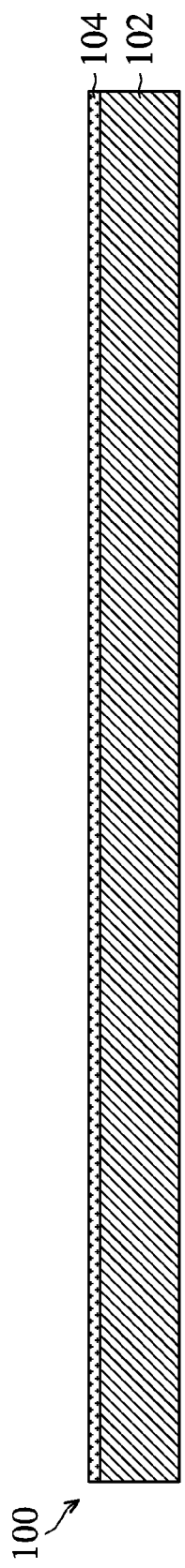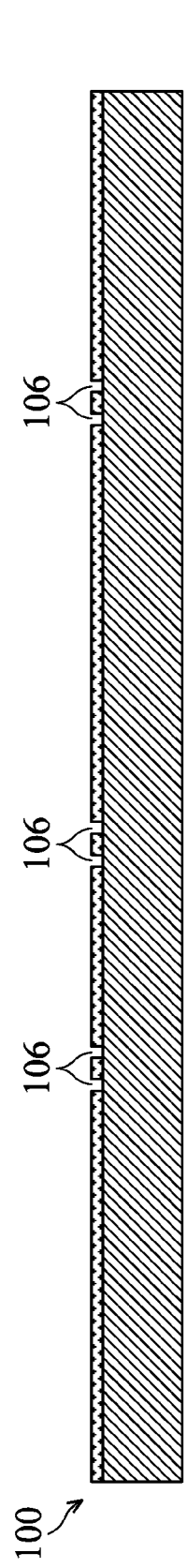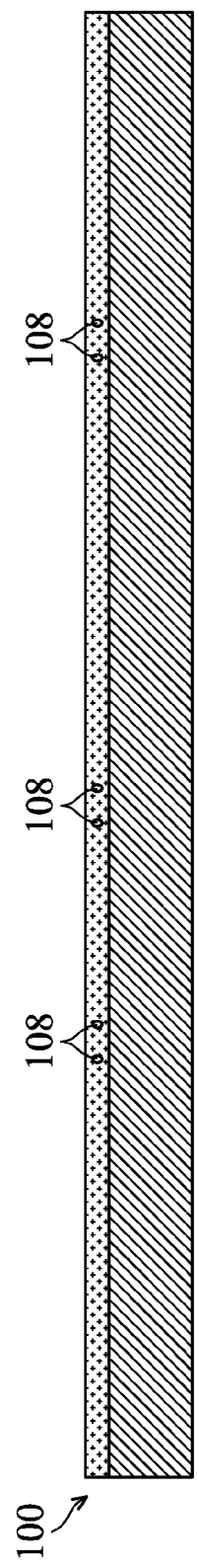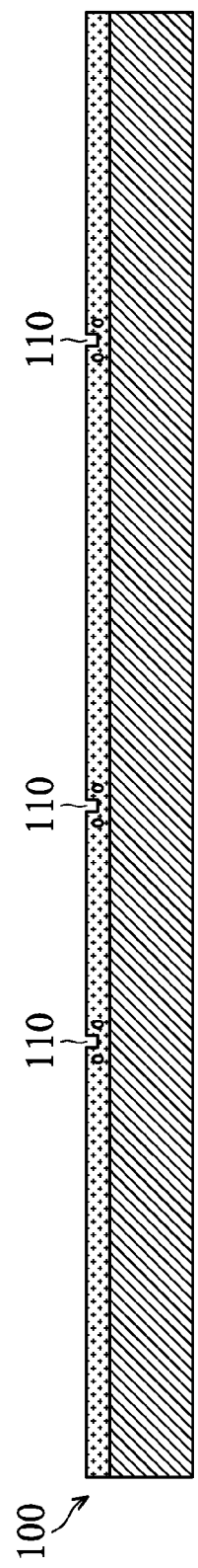

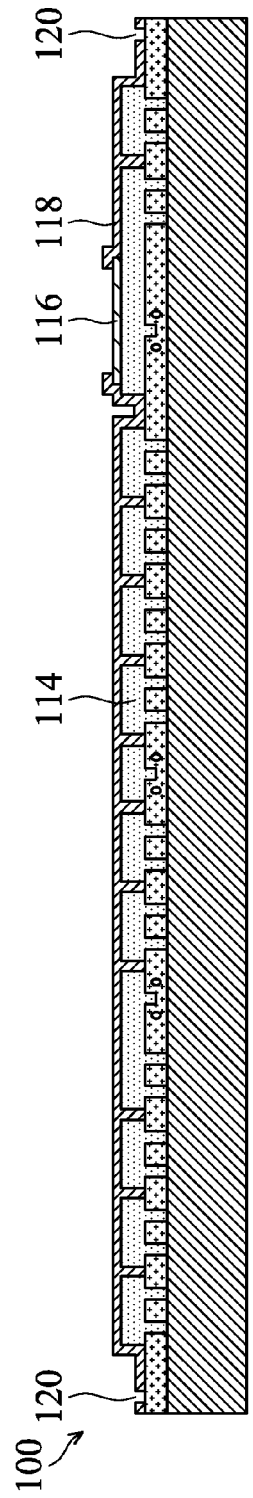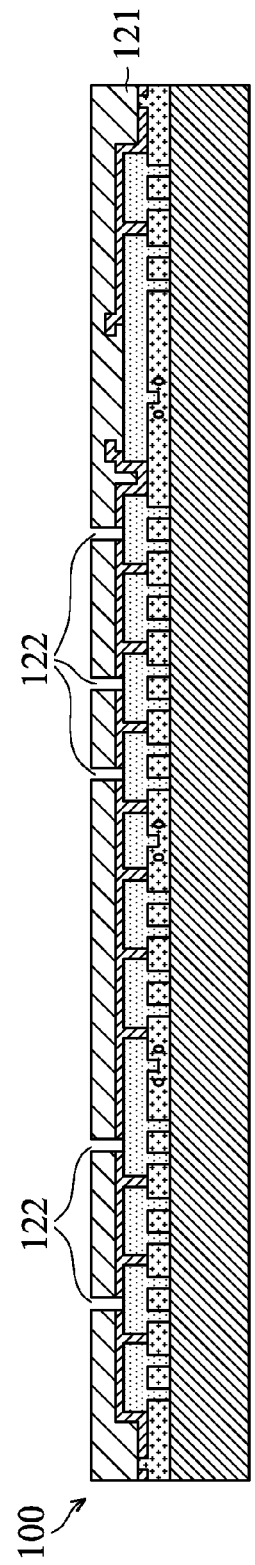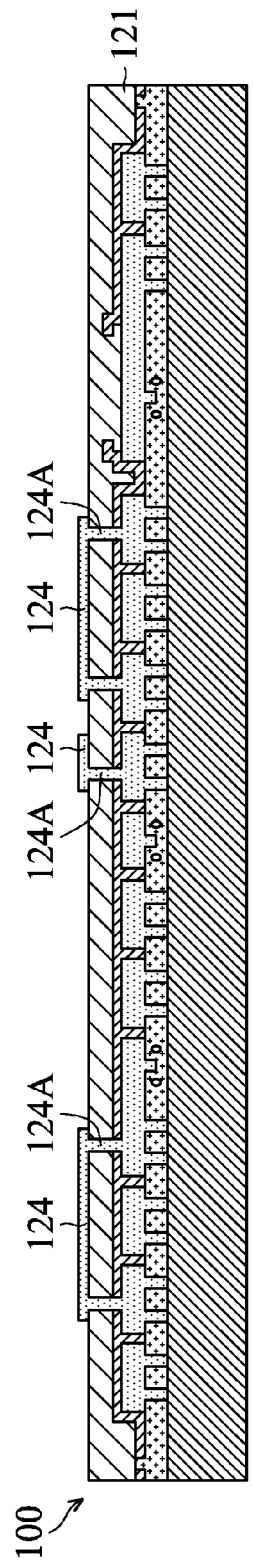

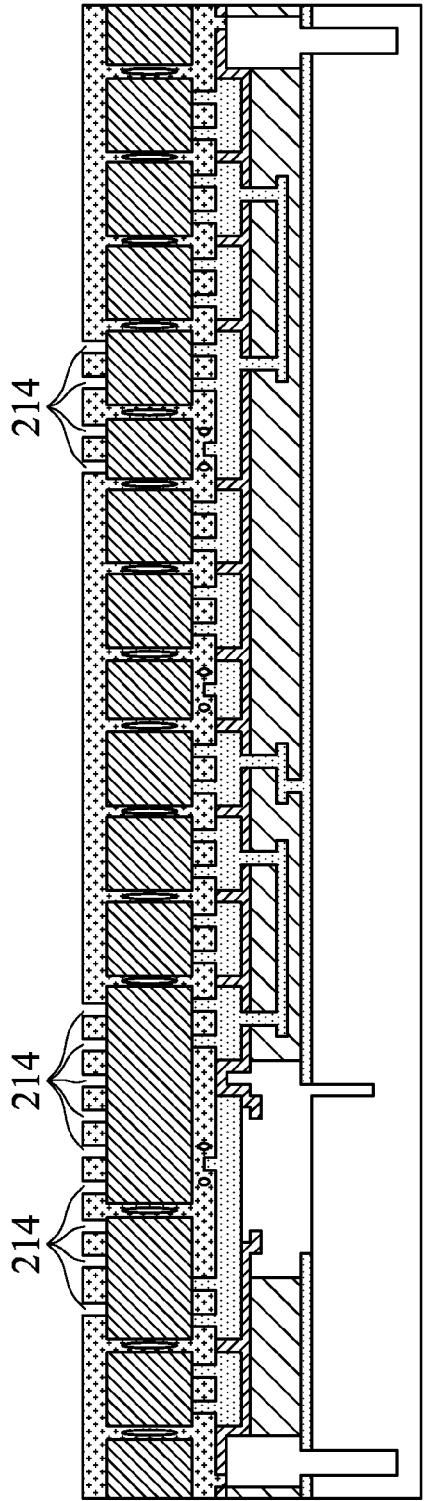
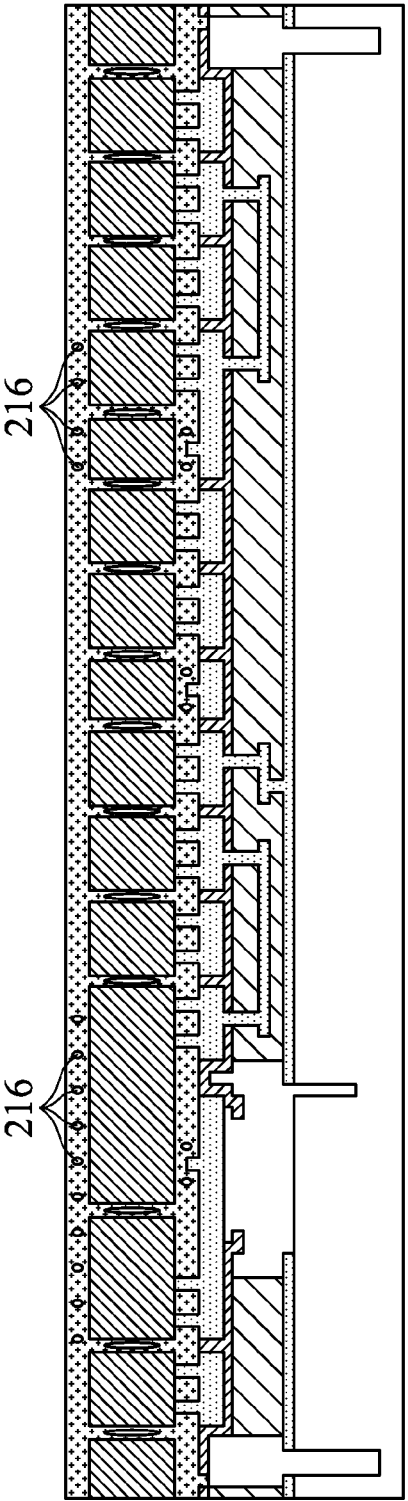
FIG. 18
FIG. 19

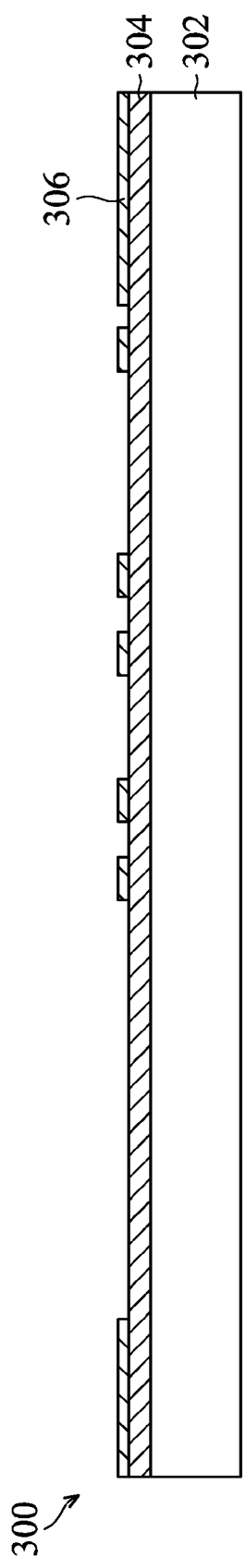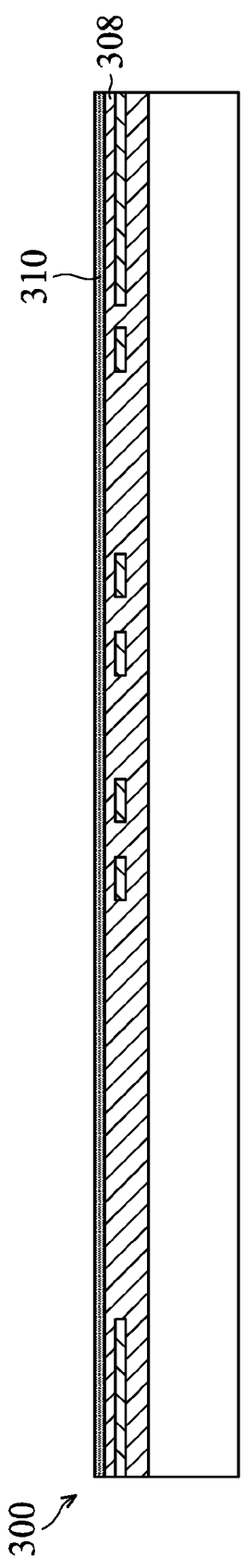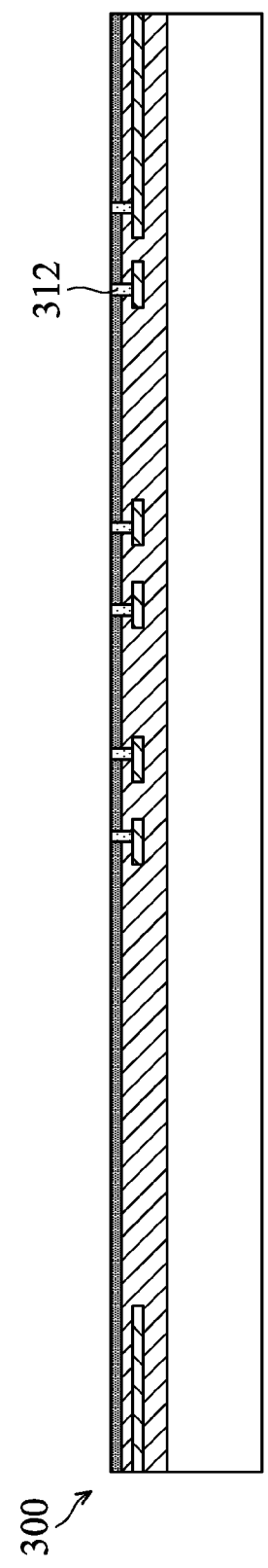

MEMS DEVICES AND METHODS FOR FORMING SAME

This application claims the benefit of the following provisionally filed U.S. patent application: Application Ser. No. 61/782,168, filed Mar. 14, 2013, and entitled "MEMS Devices and Methods for Forming Same," which application is hereby incorporated herein by reference.

BACKGROUND

Microelectromechanical systems ("MEMS") are becoming increasingly popular, particularly as such devices are miniaturized and are integrated into integrated circuit manufacturing processes. MEMS devices introduce their own unique requirements into the integration process, however. Electrically interconnecting MEMS devices is an area of unique challenges. In particular, integrating MEMS pressure sensor devices, MEMS motion sensor devices, and MEMS gyroscope sensor devices into the same integrated circuit manufacturing process has posed challenges.

BRIEF DESCRIPTION OF THE DRAWINGS

For a more complete understanding of the present embodiments, and the advantages thereof, reference is now made to the following descriptions taken in conjunction with the accompanying drawings, in which:

FIGS. 1 through 37 illustrate cross-sectional views of intermediate stages of manufacture of a MEMS device according to an embodiment.

DETAILED DESCRIPTION OF ILLUSTRATIVE EMBODIMENTS

Figure 5:
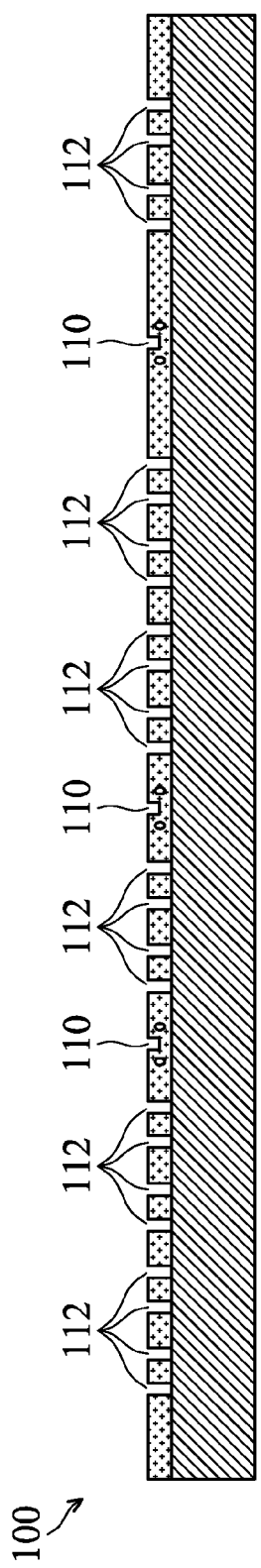

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a MEMS device with at least two cavities with at least one cavity having a low pressure and at least one cavity having a medium pressure. Other embodiments may also be applied, however, to other MEMS devices having another cavity at an atmospheric pressure.

FIGS. 1 through 37 illustrate cross-sectional views of intermediate stages of manufacture of a MEMS device 400 according to an embodiment. With reference now to FIG. 1, there is illustrated a MEMS wafer 100. The MEMS wafer 100 includes a substrate 102 and a dielectric layer 104 on a top surface of the substrate 102. The substrate 102 may be formed of silicon, silicon germanium, silicon carbide or the like. The substrate 102 may be formed of low resistive silicon. Alternatively, the substrate 102 may be a silicon-on-insulator (SOI) substrate. The SOI substrate may comprise a layer of a semiconductor material (e.g., silicon, germanium and the like) formed over an insulator layer (e.g., buried oxide and the like), which is formed in a silicon substrate. In addition, other substrates that may be used include multi-layered substrates, gradient substrates, hybrid orientation substrates, the like, or a combination thereof.

The dielectric layer 104 is formed on a top surface of the substrate 102. The dielectric layer 104 may comprise one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. The dielectric layer 104 may be deposited over substrate 102 using, for example, spinning, chemical vapor disposition (CVD), plasma enhanced chemical vapor deposition (PECVD), low pressure CVD, the like, or a combination thereof. In some embodiments, the dielectric layer 104 may be a release layer and released (i.e., removed) in subsequent process steps in order to form MEMS structures; therefore, dielectric layer 104 may also be referred to as sacrificial (SAC) dielectric layer 104.

FIG. 2 illustrates the patterning of the dielectric layer 104 to form openings 106 in the dielectric layer 104. The patterning process may be accomplished by depositing a commonly used mask material (not shown) such as photoresist over the dielectric layer 104. The mask material is then patterned and the dielectric layer 104 is etched in accordance with the pattern to form the openings 106.

FIG. 3 illustrates the formation of voids 108 in the dielectric layer 104. The voids 108 may be formed, for example, by seaming together the upper portions of the openings 106. The openings 106 may be seamed together using, for example, an oxide deposition process applied to the upper surface of dielectric layer 104 to seal off the upper portions of the openings 106. The oxide deposition may comprise a deposition process such as CVD or the like. More particularly, by controlling the deposition process, the material of dielectric layer 104 may be deposited in a non-conformable manner such that the material of dielectric layer 104 may build up on the upper portions of openings 106 faster than along the sidewalls and bottom of openings 106. This process leads to the formation of an overhang at the edge of the upper portion of the opening 106, and as the deposition process continues, the overhangs will merge, sealing off opening 106 with a plurality of seams and forming voids 108.

The voids 108 may be included in dielectric layer 104 to decrease release time in subsequent process steps. In an embodiment, the inclusion of voids 108 creates weak spots in dielectric layer 104 that reduces releasing time of MEMS structures. In some embodiments, the steps illustrates in FIGS. 2 and 3 may be omitted if release time speed is not a concern, or an alternative design for a MEMS device includes different methods of decreasing release time.

In FIGS. 4 and 5, the dielectric layer 104 is patterned, creating bump openings 110 and via openings 112. The patterning of the dielectric layer 104 may be done using, for example, a combination of photolithography and etching techniques. In some embodiments, two separate photolithography steps may be performed in order to create bump openings 110 and via openings 112. In these embodiments, a shallow etching may be performed to create bump openings 110, while a deep etching may be performed to create via openings 112. In some other embodiments, the bump openings 110 and the via openings 112 may be created by a single photolithography step.

In an embodiment, the bump openings 110 do not extend to the top surface of the substrate 102 while the via openings 110 do extend to and expose portions of the top surface of the substrate 102. Furthermore, in some embodiments, the dielectric layer 104 may be thinned (not shown) until a desired thickness is achieved. The thinning process may be implemented by using suitable techniques such as grinding, polishing, chemical etching, the like, or a combination thereof. For example, a chemical mechanical polishing (CMP) process may be used to thin dielectric layer 104. In an embodiment, the thickness of dielectric layer 104 is in a range from about 0.5 μm to about 5 μm.

Figure 6:
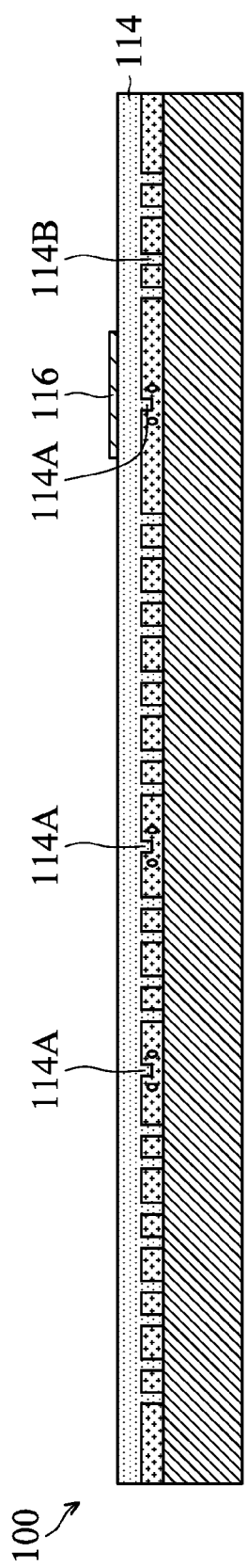

FIG. 6 illustrates the formation of a polysilicon layer 114 on the dielectric layer 104 and a mask layer 116 formed and patterned on the polysilicon layer 114. The polysilicon layer 114 fills bump openings 110 and via openings 112, forming polysilicon bumps 114A and polysilicon vias 114B respectively. The polysilicon bumps 114A may be used as mechanical bumps to limit the motion of moving elements in MEMS wafer 100, or as anti-stiction bumps. Further, the polysilicon vias 114B may be formed for electrical routing and may further act as a mechanical structure. In some embodiments, the polysilicon vias 114B may be used as a vapor hydrogen-fluoride (vapor HF) etch stop layer in subsequent process steps. In other embodiments, the layer 114 may be formed of a different material in lieu of polysilicon such as SiGe, single crystal silicon (e.g., by using a silicon-on-insulator wafer as a starting material), or the like. It should be noted that while a single polysilicon layer is illustrated, those skilled in the art will recognize that multiple polysilicon layers could be employed.

A mask layer 116 may be formed and patterned over a portion of the polysilicon layer 114. The mask layer 116 may formed out of a similar material and using similar methods as dielectric layer 104, and the mask layer 116 may be patterned using a combination of photolithography and etching techniques. In some embodiments, the mask layer 116 may act as protection for critical portions of the polysilicon layer 114 in subsequent process steps. For example, in FIG. 6, the mask layer 116 protects portions of the polysilicon layer 114 to ensure proper thickness control and surface texture. The mask layer 116 may be formed over any portion of the polysilicon layer 114 where such control is desired. If surface texture and thickness is not crucial, the mask layer 116 may be omitted.

Figure 7:
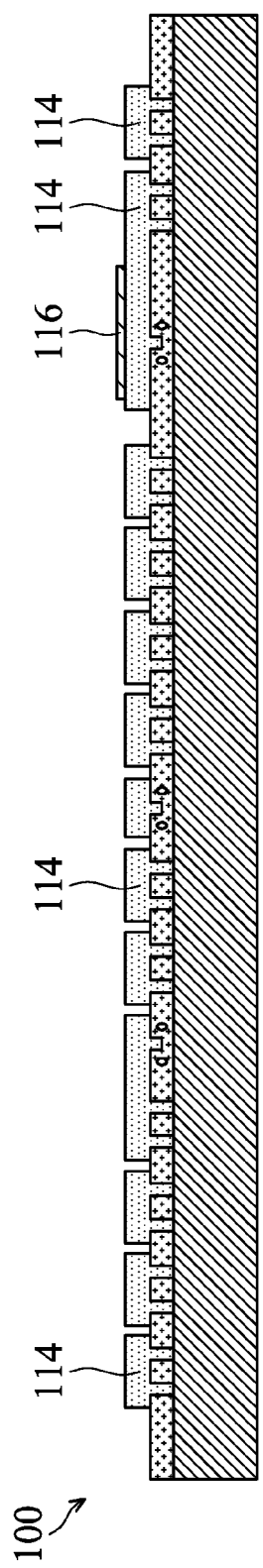

FIG. 7 illustrates the patterning of the polysilicon layer 114 to expose portions of the dielectric layer 104. In an embodiment, the polysilicon layer 114 may be patterned by a combination of photolithography and etching techniques.

FIG. 8 illustrates the formation and patterning of a dielectric layer 118 over the dielectric layer 104 and the polysilicon layer 114. In some embodiments, dielectric layer 118 may act as an etch stop layer for a subsequent etching process such as a vapor HF etching process. The dielectric layer 118 may comprise a low-stress nitride (LSN), aluminum nitride, aluminum oxide, silicon carbide, other dielectric materials that are chemically resistant to vapor HF, the like, or a combination thereof.

FIG. 9 illustrates the formation and patterning of a dielectric layer 121. The dielectric layer 121 may be formed of substantially the same material and using substantially the same methods as dielectric layer 104. The dielectric layer 121 may be blanket deposited and then undergo a grinding process (e.g., CMP or etch-back) to reach a desired flatness and/or thickness. The dielectric layer 121 may be patterned to create via openings 122 using a combination of photolithography and etching.

FIG. 10 illustrates the formation of a thin polysilicon layer 124 over the dielectric layer 121. The thin polysilicon layer 124 may formed on the dielectric layer 121 using suitable techniques such as CVD or the like. The thin polysilicon layer 124 is deposited into via openings 122, creating via portions 124A which contact the polysilicon layer 114. The thin polysilicon layer 124 acts as electrical routing (e.g., using via portions 124A). The thin polysilicon layer 124 also acts as a shield for various components of MEMS wafer 100 (e.g., substrate 102 and polysilicon layer 114) in subsequent process steps.

Figure 11:
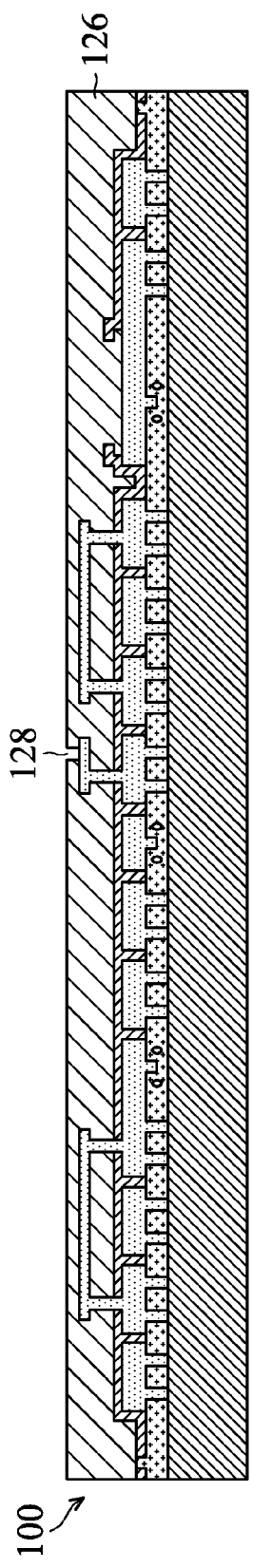

FIG. 11 illustrates the formation and patterning of a dielectric layer 126. The dielectric layer 126 may be formed of substantially the same material and using substantially the same methods as dielectric layer 104. The thickness of the dielectric layers 126, 121, and 104 may be designed to control parasitic feedback through capacitance and/or to control the gap between the subsequent movable element of MEMS structures 206, 208, and 210 and the polysilicon layer 114 and the thin polysilicon layer 130 (see FIG. 25). The dielectric layer 126 may be blanket deposited and then undergo a grinding process (e.g., CMP or etch-back) to reach a desired flatness and/or thickness. The dielectric layer 126 may be patterned to create one or more via openings 128 using a combination of photolithography and etching.

Figure 12:
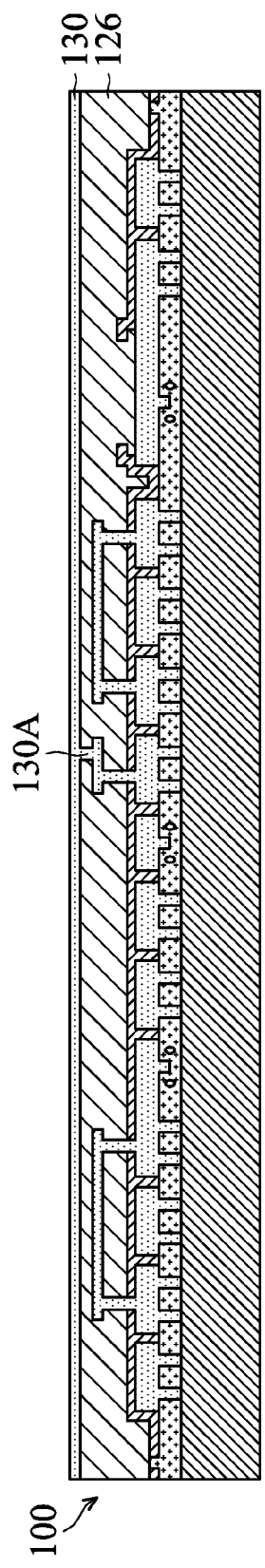

FIG. 12 illustrates the formation of a thin polysilicon layer 130 over the dielectric layer 126. The thin polysilicon layer 130 may formed on the dielectric layer 126 using suitable techniques such as CVD or the like. The thin polysilicon layer 130 is deposited into the via opening 128, creating a via portion 130A which contacts the thin polysilicon layer 124. The thin polysilicon layer 130 acts as electrical routing (e.g., using via portion 130A). The thin polysilicon layer 130 also acts as a shield for various components of MEMS wafer 100 (e.g., substrate 102 and thin polysilicon layer 124) in subsequent process steps. The thin polysilicon layer 130 also acts as a bonding interface layer; therefore, other suitable bonding materials such as silicon, amorphous silicon, silicon doped with impurities, combinations thereof, and the like may be used in lieu of polysilicon.

Figure 13:
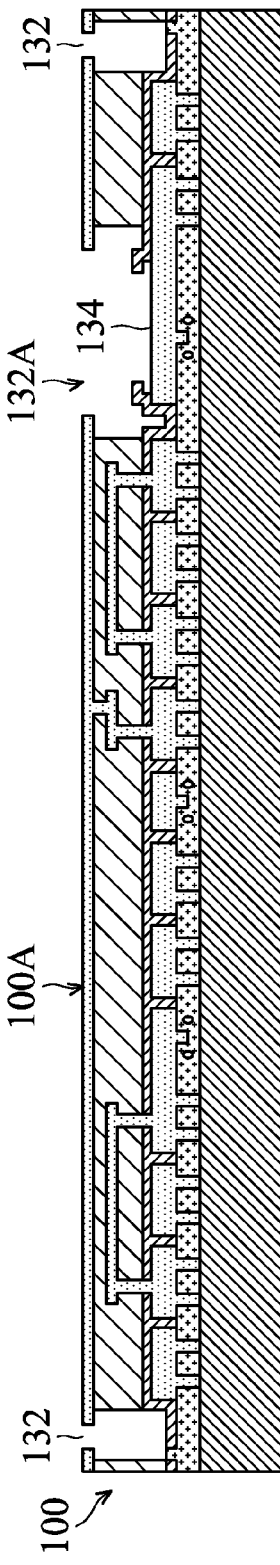

FIG. 13 illustrates the formation of openings 132. In an embodiment, the openings 132 are formed by etching portions of thin polysilicon layer 130, the dielectric layer 126, the dielectric layer 121, and the mask layer 116. This may be done using, for example, a combination of wet and dry etching techniques. Notably, one of the openings 132 (132A) exposes region 134 of polysilicon layer 114. The region 134 of polysilicon layer 114 may act as a membrane of a pressure sensor device in a completed MEMS device 400 (e.g., see element 404 in FIG. 37). In the completed MEMS device 400, opening 132A exposes this portion of polysilicon layer 114 to a type of pressure (e.g., ambient pressure or sealed pressure depending on the design of MEMS device 400). The etching of thin polysilicon layer 130, the dielectric layer 126, the dielectric layer 121, and the mask layer 116 completes a MEMS wafer 100 of MEMS device 400. MEMS wafer 100 has a top and bottom surface, 100A and 100B respectively.

Figure 14:
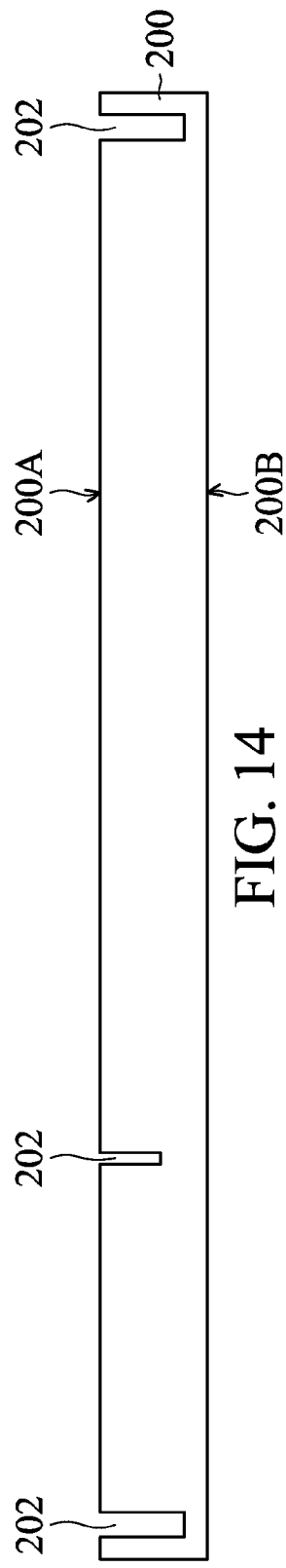

FIG. 14 illustrates a carrier wafer 200 in an intermediate stage of processing. The carrier wafer 200 may be a substrate that is substantially similar to substrate 102 in the MEMS wafer 100. The carrier wafer 200 is patterned to include openings 202 using for example etching techniques adopting an etching loading effect. The carrier wafer 200 also has a top and bottom surface, 200A and 200B respectively.

Figure 15:
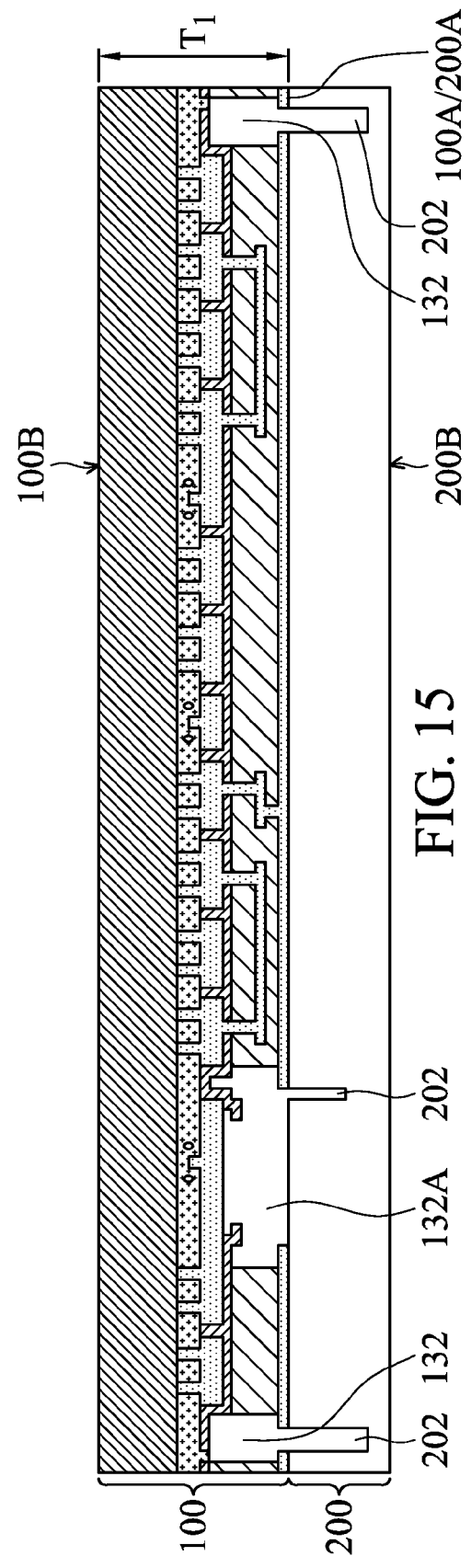

FIG. 15 illustrates the bonding of the MEMS wafer 100 to the carrier wafer 200. In some embodiments, the top surface 100A of the MEMS wafer 100 is bonded to the top surface 200A of the carrier wafer 200. The openings 132 of the MEMS wafer 100 may be aligned to openings 202 of the carrier wafer 200. The MEMS wafer 100 may be bonded to the carrier wafer 200 using any suitable technique such as fusion bonding, anodic bonding, eutectic bonding, the like, or a combination thereof. In an embodiment, the MEMS wafer 100 may be fusion bonded to the carrier wafer 200 using thin polysilicon layer 130 as a bonding interface.

After the MEMS wafer 100 is bonded to the carrier wafer 200, the MEMS wafer 100 may be thinned to have a thickness $T_1$. The thinning process may include grinding and CMP processes, etch back processes, or other acceptable processes performed on the surface 100B of the MEMS wafer 100 (i.e., substrate 102). As a result of this thinning process, the MEMS wafer 100 may have a thickness from about 5 μm to about 60 μm.

Figure 16:
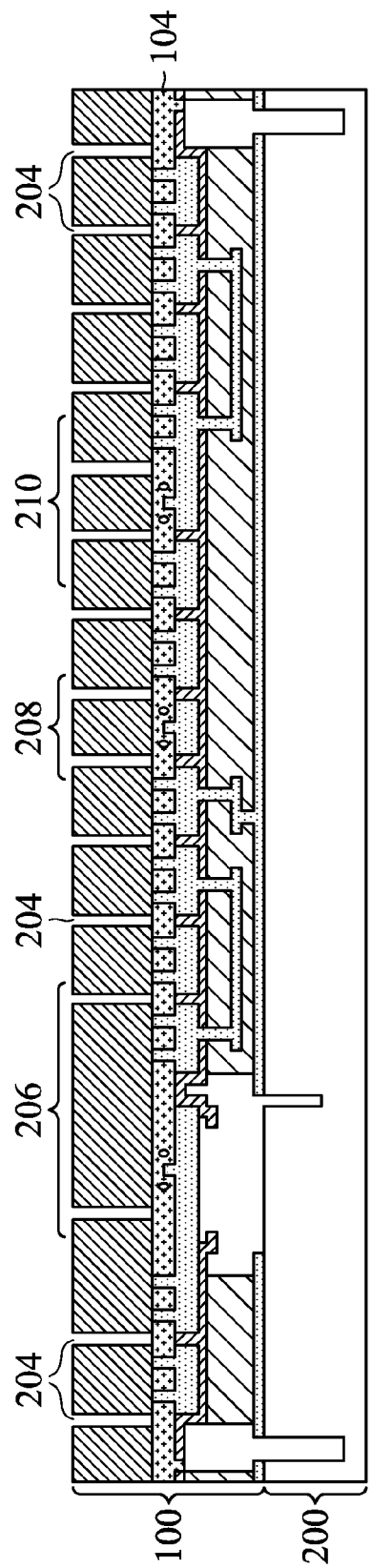

FIG. 16 illustrates the patterning of the MEMS wafer 100 to form MEMS structures. In some embodiments, portions of substrate 102 are patterned using for example, a combination of photolithography and etching techniques. The patterning of the substrate 102 forms openings 204 that may expose portions of the dielectric layer 104. The portions of the remaining substrate 102 may form various MEMS structures (e.g., MEMS structures 206, 208, and 210).

Figure 17:
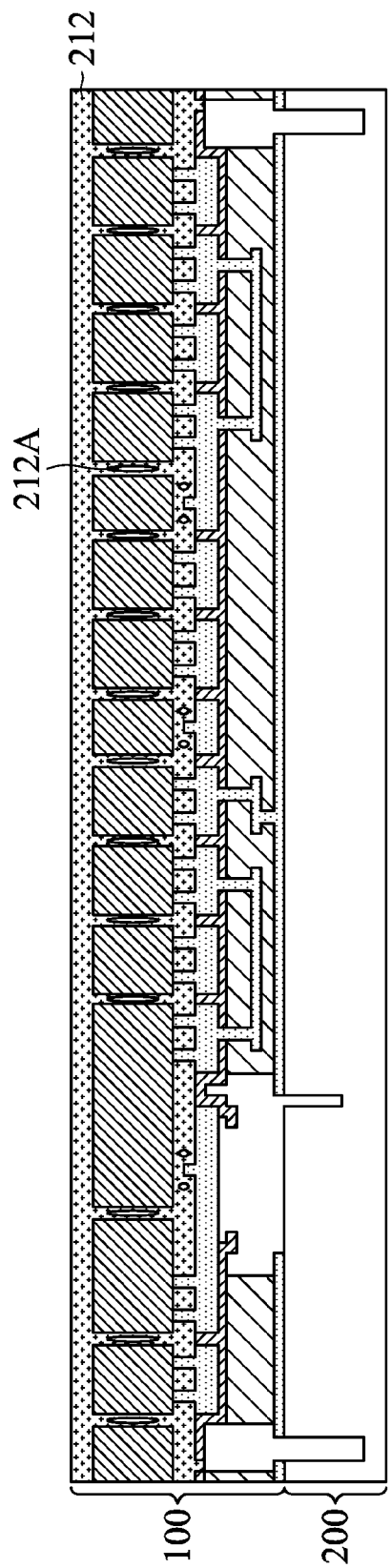

FIG. 17 illustrates the formation of a dielectric layer 212 on the back surface 100B and in the openings 204 of the MEMS wafer 100. The dielectric layer 212 may be formed of substantially the same material and using substantially the same methods as dielectric layer 104. The dielectric layer 212 may be deposited into the openings 204 to support the MEMS structures 206, 208, and 210 until the dielectric layer 212 is released (i.e. removed) in subsequent processing. In an embodiment, voids 212A may be formed in the portions of the dielectric layer 212 in the openings 204. These voids 212A may be the result of the high aspect ratio of the openings 204 or the voids 212A may be purposefully formed to reduce the release time of the dielectric layer 212. The thickness of the dielectric layer 212 may be designed to control the gap between the subsequent movable elements of MEMS structures 206, 208, and 210 and the polysilicon layer 222 (see FIG. 25). In some embodiments, the dielectric layer 212 may be blanket deposited and then undergo a thinning process (e.g., CMP or etch-back) to reach a desired flatness and/or thickness.

FIGS. 18 and 19 illustrate the formation of openings 214 in the dielectric layer 212 and the seaming of the openings 214 to form voids 216. The openings 214 and voids 216 may be formed using substantially the same methods as the openings 106 and the voids 108. The voids 216 may be included in dielectric layer 212 to decrease release time in subsequent process steps. In an embodiment, the inclusion of voids 216 creates weak spots in dielectric layer 212 that reduces releasing time of MEMS structures. In some embodiments, the steps illustrates in FIGS. 18 and 19 may be omitted if release time speed is not a concern, or an alternative design for a MEMS device includes different methods of decreasing release time.

Figure 20:
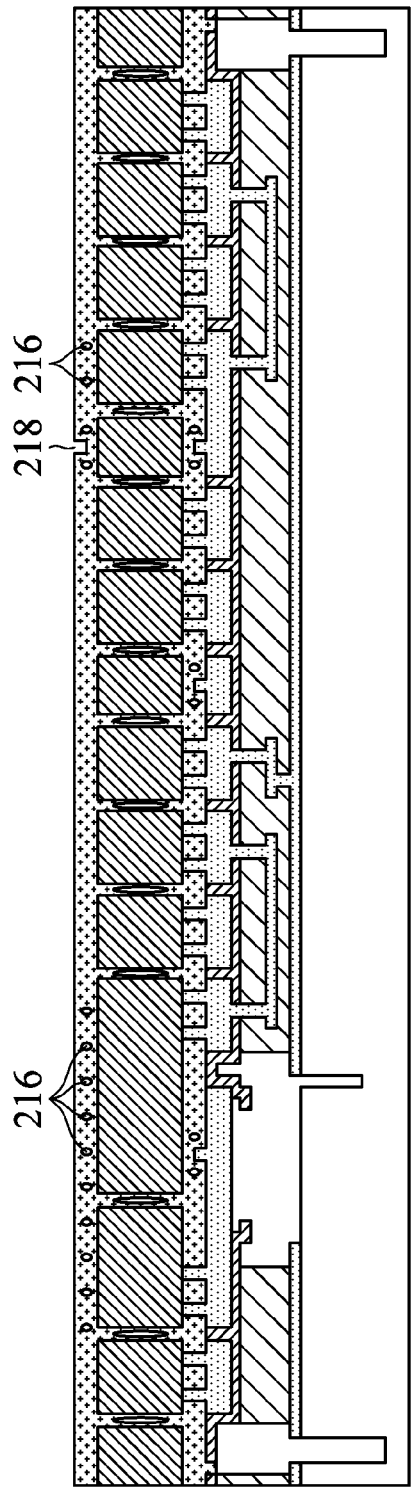
Figure 21:
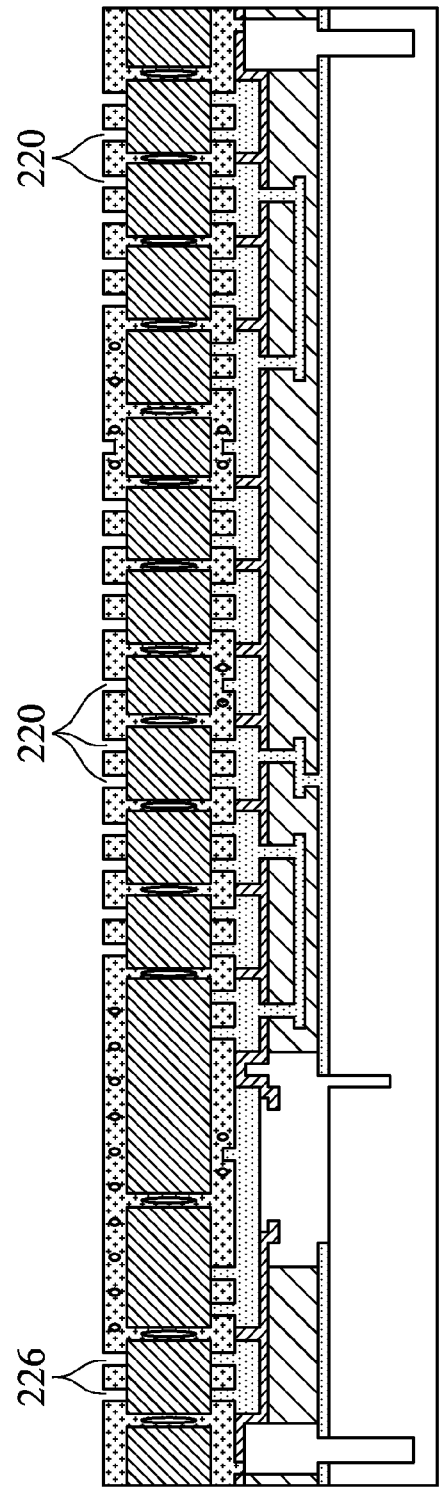

In FIGS. 20 and 21, the dielectric layer 212 is patterned, creating a bump opening 218 and via openings 220. The bump opening 218 and the via openings 220 may be formed using substantially the same methods as the bump openings 110 and the via openings 112.

Figure 22:
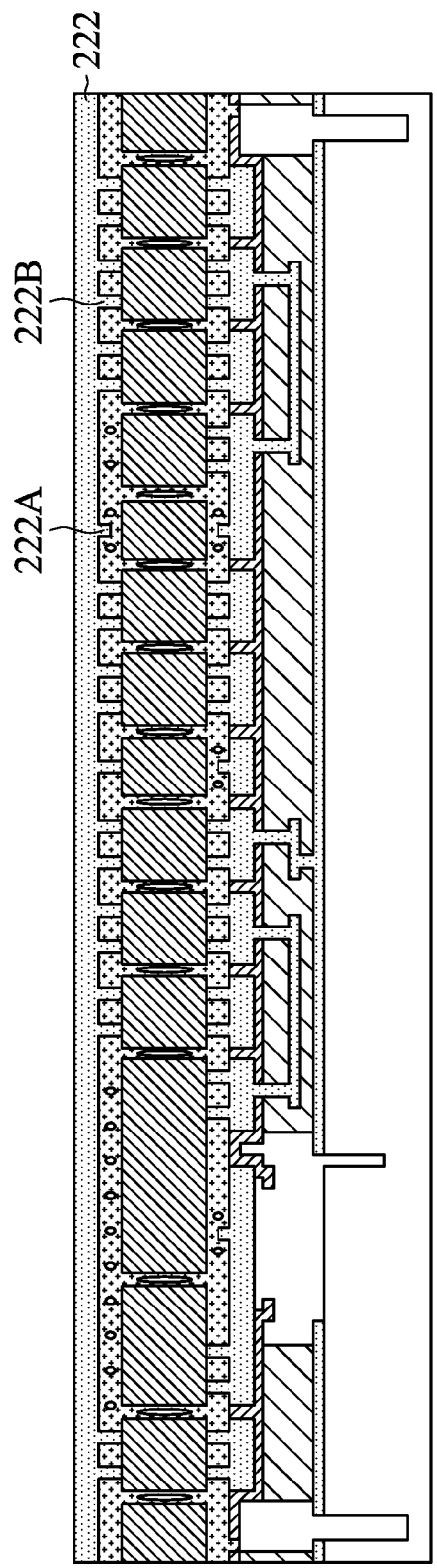

FIG. 22 illustrates the formation of a polysilicon layer 222 on the dielectric layer 212. The polysilicon layer 222 fills the bump opening 218 and the via openings 220, forming a polysilicon bump 222A and polysilicon vias 222B respectively. The polysilicon bump 222A may be used as mechanical bumps to limit the motion of moving elements in MEMS wafer 100, or as anti-stiction bumps. Further, the polysilicon vias 222B may be formed for electrical routing and may further act as a mechanical structure. In some embodiments, the polysilicon vias 222B may be used as a vapor HF etch stop layer in subsequent process steps. In other embodiments, the layer 222 may be formed of a different material in lieu of polysilicon such as SiGe, or the like. It should be noted that while a single polysilicon layer is illustrated, those skilled in the art will recognize that multiple polysilicon layers could be employed.

Figure 23:
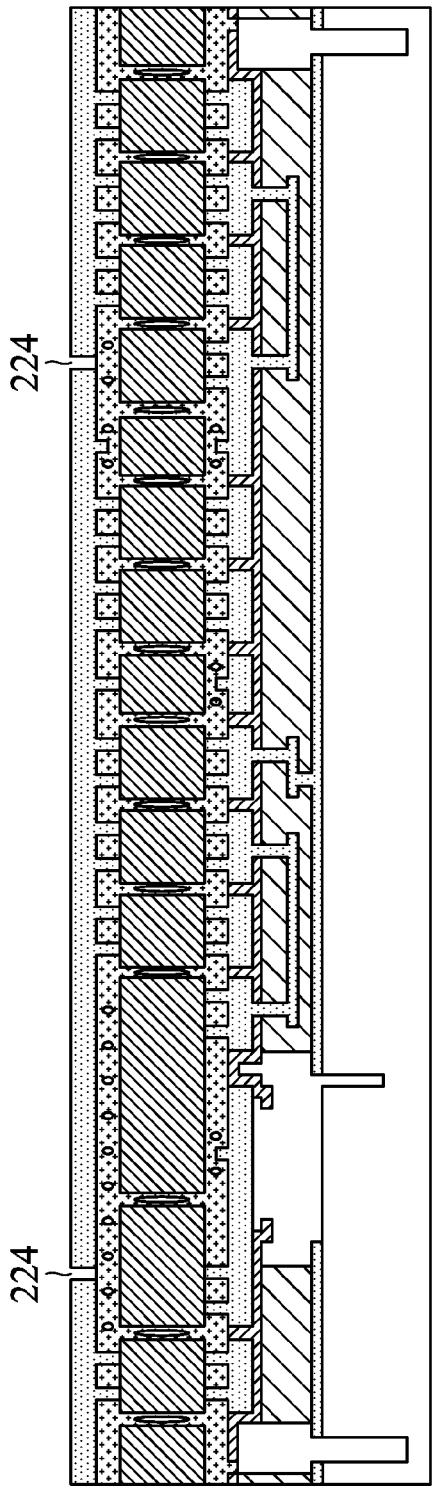

FIG. 23 illustrates the patterning of the polysilicon layer 222 to form openings 224 exposing portions of the dielectric layer 212. In an embodiment, the polysilicon layer 222 may be patterned by a combination of photolithography and etching techniques. In some embodiments, the openings 224 may substantially be over the voids 216 so that the subsequent release process of the MEMS structures may be performed with a decreased release time.

Figure 24:
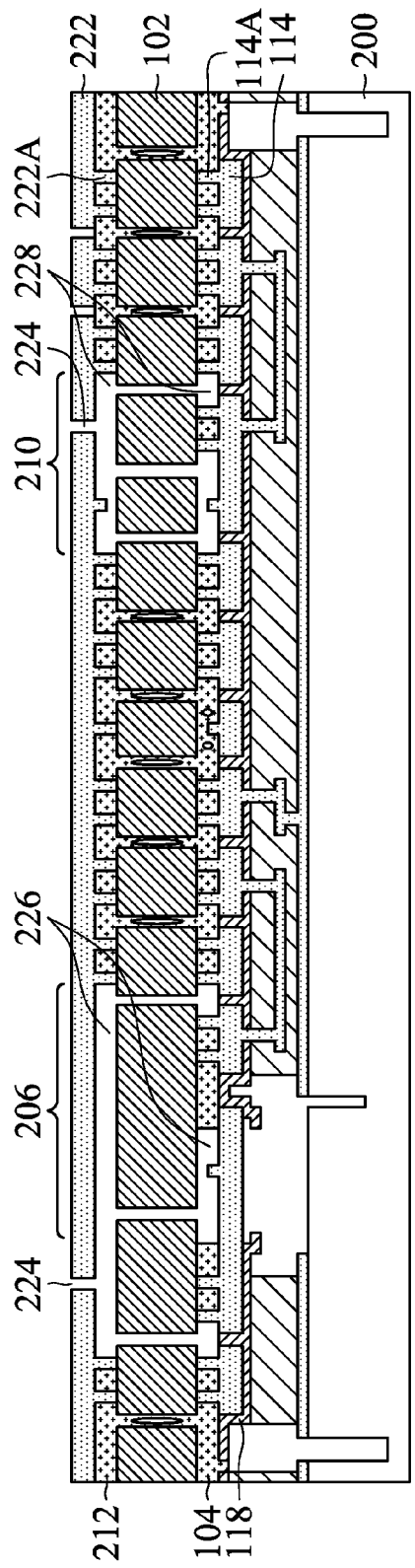

FIG. 24 illustrates the release of the MEMS structures 206 and 210 by a vapor HF etching of portions of the dielectric layers 104 and 212. The removal of portions of the dielectric layers 104 and 212 forms cavities 226 and 228 surrounding MEMS structures 206 and 210, respectively. This type of etch process has a high selectivity between the dielectric layers 104 and 212, dielectric layer 118, polysilicon layers 114 and 222, and substrate 102 so that that dielectric layer 118, polysilicon layers 114 and 222, and substrate 102 are not significantly attacked during the removal of portions of the dielectric layers 104 and 212. Furthermore, polysilicon layer 114 (e.g., vias 114A) and polysilicon layer 222 (e.g. vias 222A) protect portions of the dielectric layers 104 and 212 during the etch process, and these protected regions may be referred to as anchor regions. This etch process allows for movement of the movable elements of MEMS structures 206 and 210 in at least one axis as the portions of dielectric layers 104 and 212 are removed. It should be noted that the dielectric layers to be removed depend on layout design.

Figure 25:
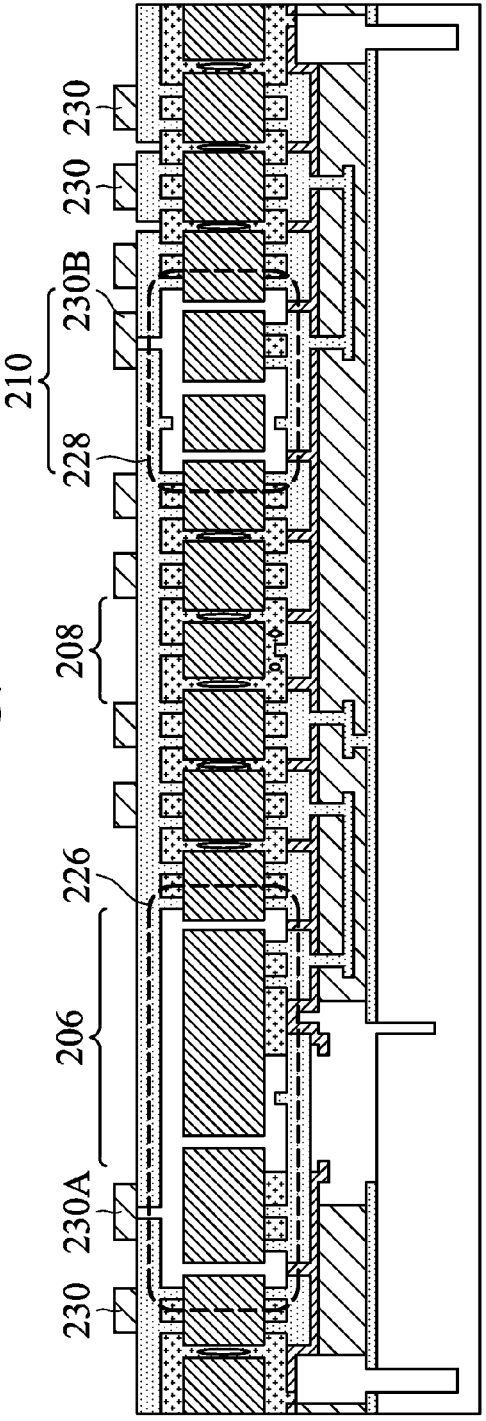

FIG. 25 illustrates the formation of conductive bonds 230 over the substrate 102 (i.e., bottom surface 100B of the MEMS wafer 100). The conductive bonds may be used for eutectic bonding in subsequent process steps and may be used to seal the cavities 226 and 228 (e.g. conductive bonds 230A and 230B). The conductive bonds 230A and 230B may be formed to cover the openings 224 in the polysilicon layer 222 to seal the cavities 226 and 228. The pressure of the sealed cavities 226 and 228 may be defined by the conditions of the formation of the conductive bonds 230. In some embodiments, the sealed cavities 226 and 228 may have a low pressure (high vacuum) as the formation of the conductive bonds 230 (including 230A and 230B) may be performed in a low pressure processing environment. In an embodiment, the cavities 226 and 228 may have a pressure less than about 10 millibars (mbar) and may be from about $1E^{-3}$ mbar to about 10 mbar. The conductive bonds 230 may comprise AlCu, Ge, Au, the like, or a combination thereof. The sealed cavities 226 and 228 may be referred to as low pressure cavities as they are capable of being formed with and maintaining a low pressure.

Figure 26:
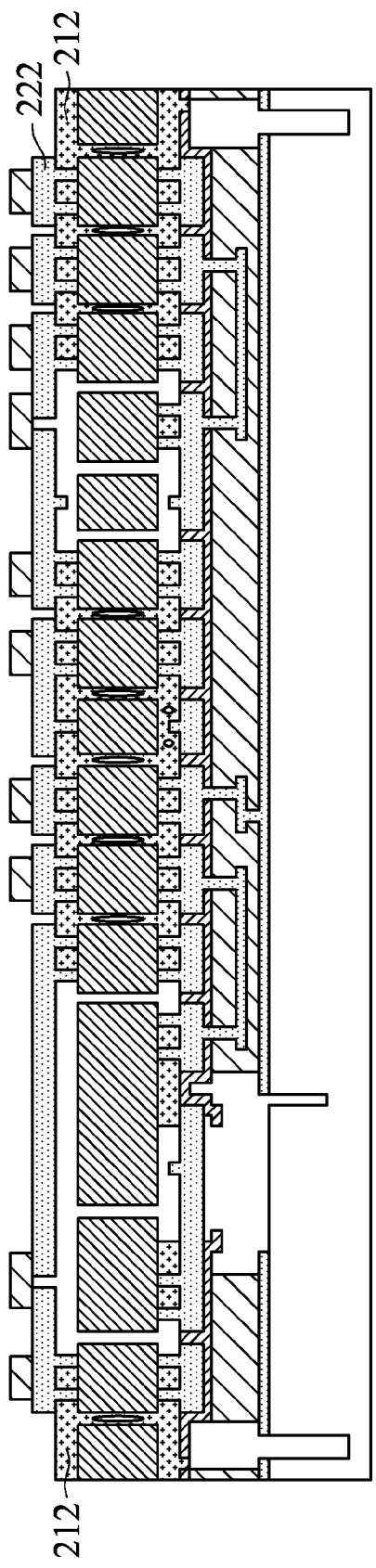

FIG. 26 illustrates the patterning of the polysilicon layer 222 to expose portions of the dielectric layer 212. In an embodiment, the polysilicon layer 222 may be patterned by a combination of photolithography and etching techniques.

Figure 27:
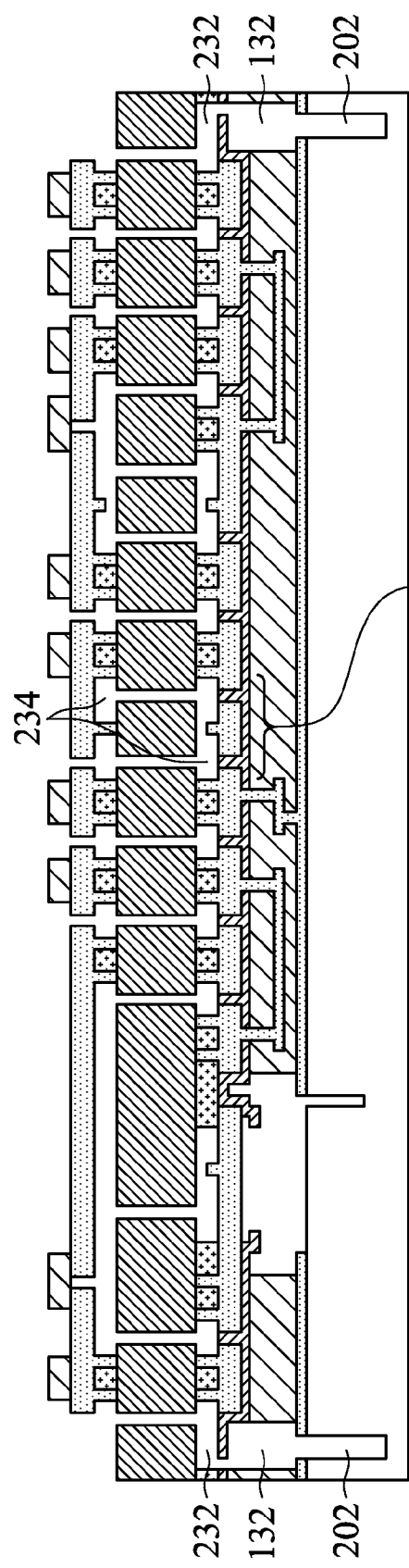

FIG. 27 illustrates the release of the MEMS structures 208 by a vapor HF etching of portions of the dielectric layers 104 and 212. The removal of portions of the dielectric layers 104 and 212 forms a cavity 234 surrounding MEMS structure 208, respectively. Also, the vapor HF etching process removes outer portions of the dielectric layers 212 and to form openings 232 which align with previously formed openings 132. This type of etch process has a high selectivity between the dielectric layers 104 and 212, dielectric layer 118, polysilicon layers 114 and 222, and substrate 102 so that that dielectric layer 118, polysilicon layers 114 and 222, and substrate 102 are not significantly attacked during the removal of portions of the dielectric layers 104 and 212. Furthermore, polysilicon layer 114 (e.g., vias 114A) and polysilicon layer 222 (e.g. vias 222A) protect portions of the dielectric layers 104 and 212 during the etch process, and these protected regions may be referred to as anchor regions. This etch process allows for movement of the movable elements of MEMS structure 208 in at least one axis as the portions of dielectric layers 104 and 212 are removed. It should be noted that the dielectric layers to be removed depend on layout design.

FIGS. 28 through 33 illustrate cross-sectional views of the formation of a cap wafer 300 for inclusion in the completed MEMS device 400 according to an embodiment. The cap wafer 300 may or may not be a CMOS wafer, which may or may not have electrical circuits (not shown). In particular the cap wafer 300 may include various active devices such as transistors, capacitors, resistors, diodes, photodiodes, fuses, and the like. The electrical circuits may be interconnected to perform one or more functions suitable for a particular application, which may or may not be related to the MEMS structures 206, 208, and 210. FIG. 28 illustrates cap wafer 300 as having substrate 302, a dielectric layer 304, and patterned metal lines 306. The metal lines 306 may be used for electrical routing.

FIG. 29 illustrates the formation of a dielectric layer 308 over the metal lines 306 and the dielectric layer 304. The dielectric layer 308 may be formed of similar materials and by using similar processes as the dielectric layer 104. The formation of the dielectric layer 308 may include a grinding process (e.g., CMP) to achieve a desired topography and thickness. A dielectric layer 310 may be formed over the dielectric layer 308. The dielectric layer 310 may be formed of similar materials and by using similar processes as the dielectric layer 104. In some embodiments, the dielectric layer 310 is formed of silicon nitride and is used as a passivation layer.

FIG. 30 illustrates insertion of contact plugs 312 into the cap wafer 300. The contact plugs 312 may be formed of tungsten, although other metallic materials such as aluminum or copper may also be used. The contact plugs 312 may be formed for example, by patterning the dielectric layer 310 and the dielectric layer 308, exposing the metal lines 306. A metallic material, such as tungsten, may be deposited in the patterned openings and a CMP technique may be used so that the top surface of contact plugs 312 may be level with the top surface of the dielectric layer 310. Contact plugs 312 may be electrically and physically connected to metal lines 306.

Figure 31:
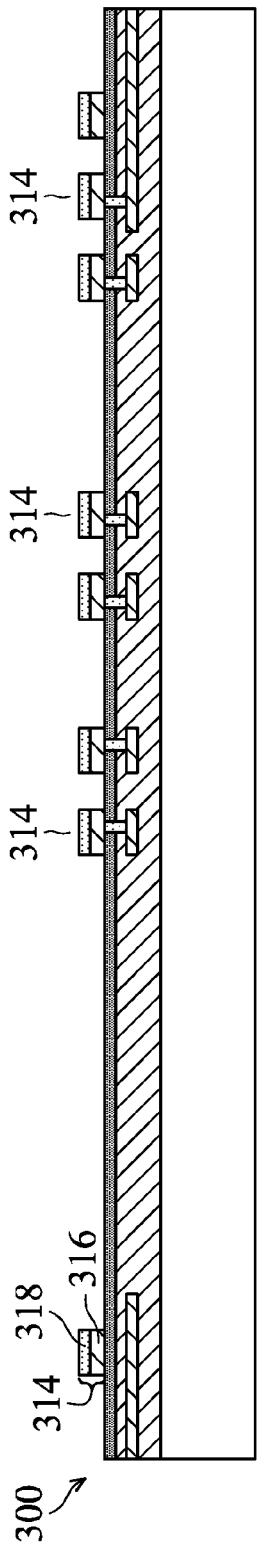

FIG. 31 illustrates the formation of bonding material layers 314 (alternatively referred to as bonds 314) over a top surface of the dielectric layer 310. The bonding material layers 314 may comprise multiple layers 316 and 318 and may be blanket deposited and patterned using for example physical vapor deposition (PVD) and photolithography/etching. The bonding material layer 316 may comprise a layer of aluminum copper under a bonding material layer 318 comprising germanium although other metallic materials such as gold may also be used. The bonding material layers 314 may act as a eutectic bonding material for a subsequent bonding process. The bonding material layers 314 may or may not be electrically connected to the metal lines 306 via the contact plugs 312.

Figure 32:
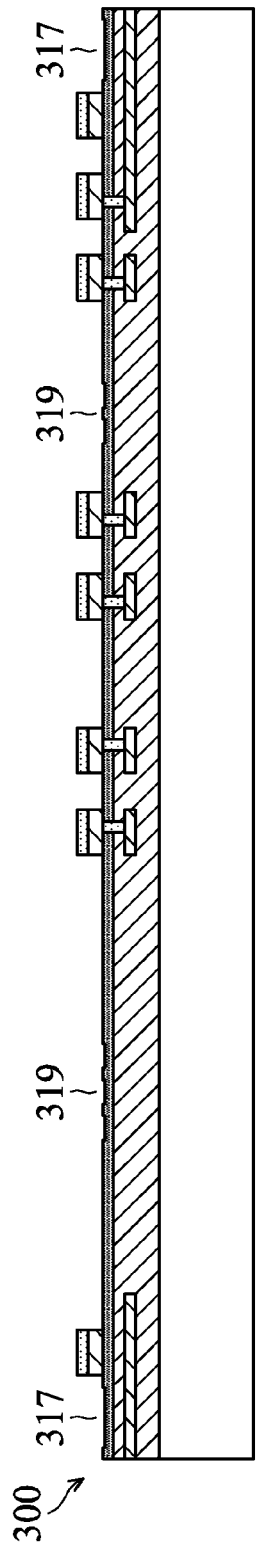

In FIG. 32, a shallow etching is performed on portions of the dielectric layer 310 to form shallow recesses 317. The shallow recesses 317 may facilitate the exposure of portions of the metal lines 306 in a subsequent processing step. Furthermore, the etching of dielectric layer 310 may form bumps 319. The bumps 319 may serve a variety of purposes. For example, in an embodiment, the bumps 319 are mechanical bumps included to limit the motion of moving elements in MEMS device 400.

Figure 33:
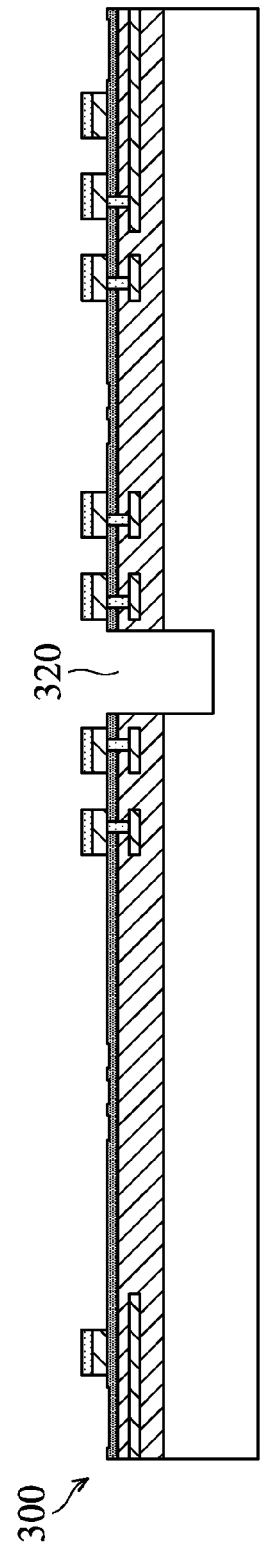

In FIG. 33, a cavity 320 is formed in cap wafer 300. The cavity 320 may function as a sealed cavity in a motion sensor or accelerometer device of MEMS device 400. The formation of cavity 320 may include known etching techniques.

Figure 34:
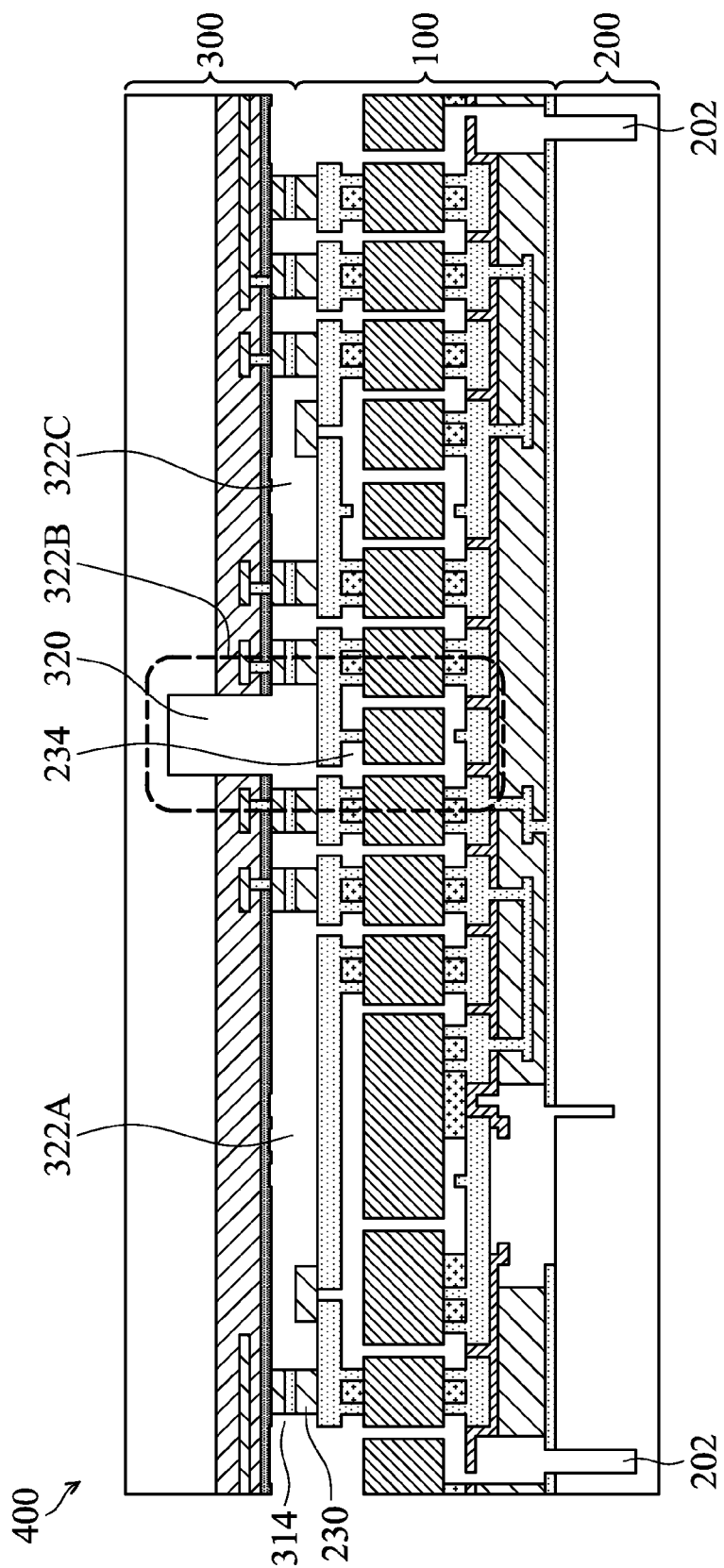

FIG. 34 illustrates the bonding of the cap wafer 300 to the MEMS wafer 100 and the carrier wafer 200. The cap wafer 300 may be bonded to the MEMS wafer 100 by eutectic bonding between the bonds 230 and bonds 314. The bonding of the cap wafer 300 to the MEMS wafer 100 forms three cavities 322A, 322B, and 322C between the cap wafer 300 and the polysilicon layer 222 and 114. The pressure of the sealed cavities 322A, 322B, and 322C may be defined by the conditions of the eutectic bonding process between the cap wafer 300 and the MEMS wafer 100. In some embodiments, the sealed cavities 322 may have a medium pressure (medium vacuum) as the eutectic bonding process may performed in a medium pressure processing environment. In an embodiment, the cavities 322 (322A, 322B, and 322C) may have from about 0.1 mbar to about 500 mbar. The conductive bonds 230 may comprise AlCu, Ge, Au, the like, or a combination thereof. The sealed cavities 322 may be referred to as medium pressure cavities as they are capable of being formed with and maintaining a medium pressure.

Figure 35:
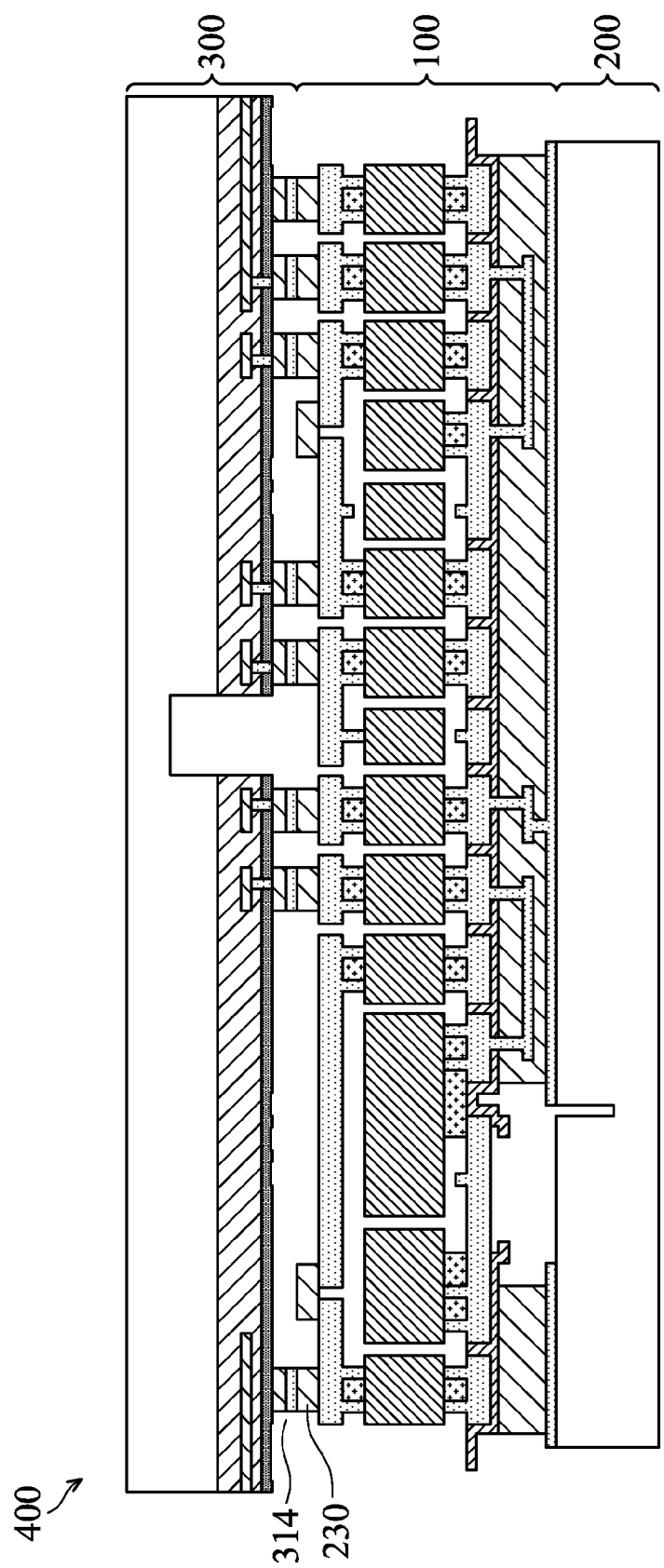

In FIG. 35, a grinding process is performed to remove portions of the MEMS wafer 100 and the carrier wafer 200. The grinding process may also be referred to as an open pad grinding (OPG) which exposes portions of the cap wafer 300 and may be done using known grinding techniques. The OPG may be facilitated by the inclusion of openings 202 in the carrier wafer 200 (see FIG. 34). For example, the portions of the MEMS wafer 100 and the carrier wafer 200 may be easily removed by removing a small portion of the carrier wafer 200 (defined by the placement of openings 202).

Figure 36:
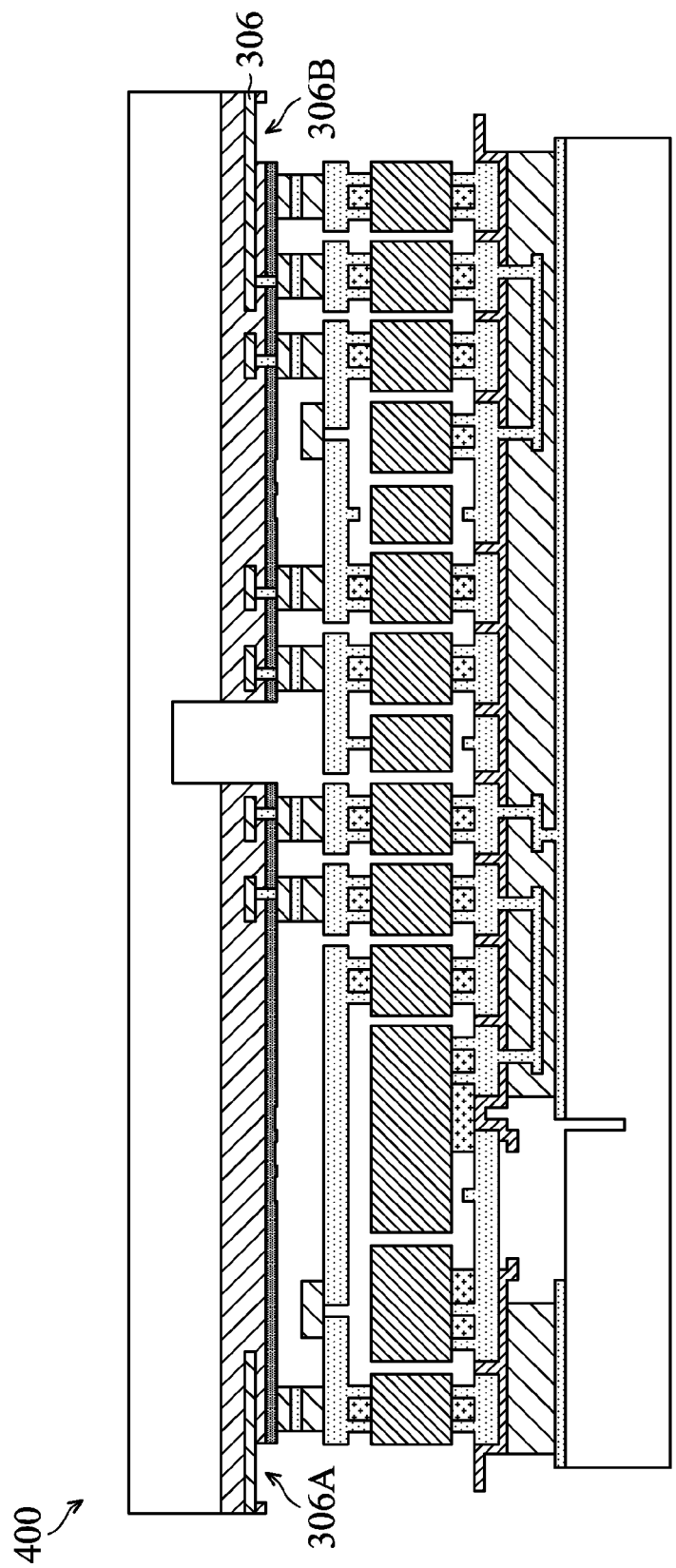

In FIG. 36, portions of the dielectric layer 310 and the dielectric layer 308 may also be removed (e.g., using a dry etch) to expose portions of the metal lines 306. These exposed portions of the metal lines 306 (i.e., portions 306A and 306B) may be used as input/output pads to electrically couple circuits in the cap wafer 300 to external circuits (not shown).

Figure 37:
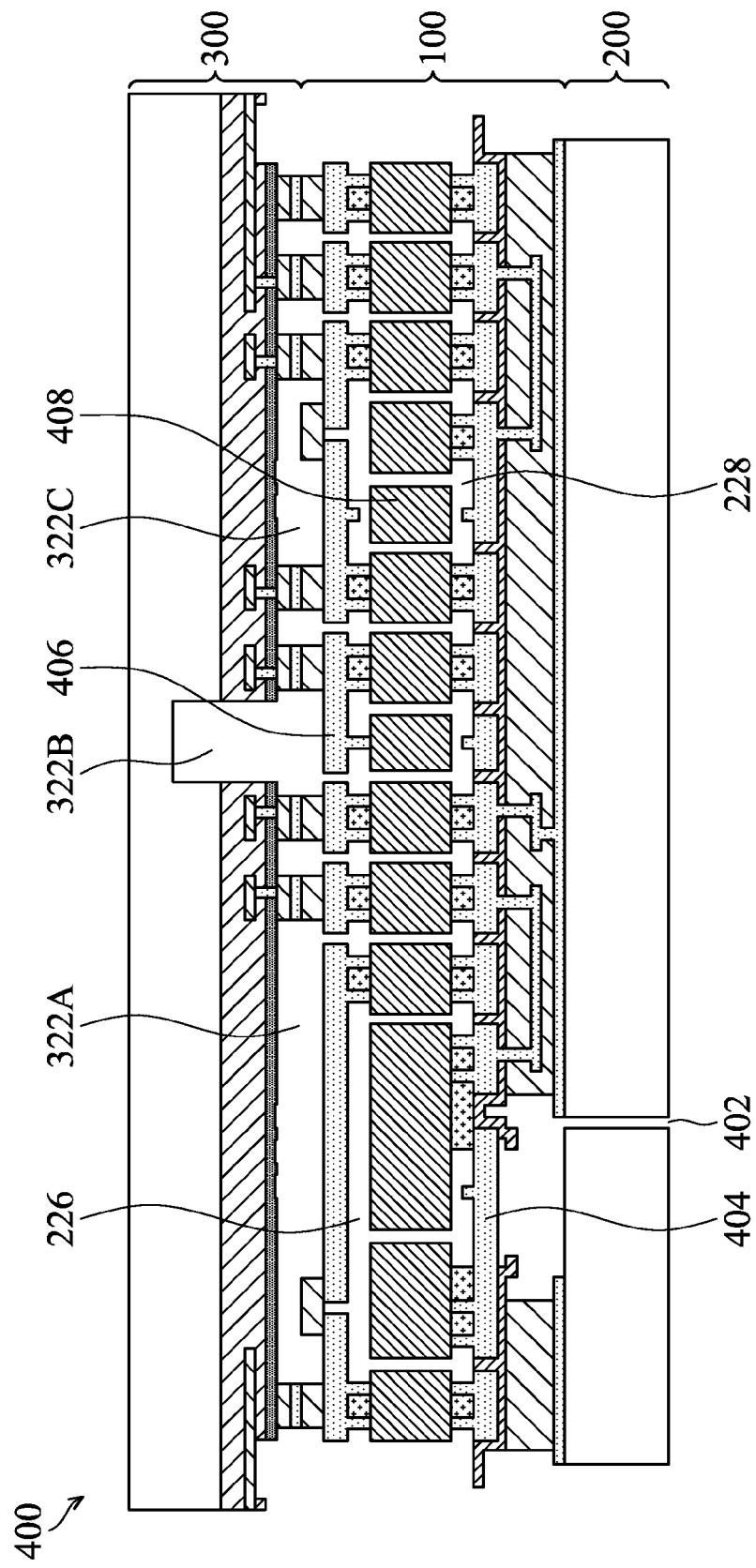

In FIG. 37, the backside of the carrier wafer 200 may be thinned to expose a cavity 402 to ambient pressure (open air environment). In some embodiments, the cavity 402 has a pressure of about 1 atmosphere. The thinning of the carrier wafer 200 may include known etching techniques such as CMP, etch-back, or the like.

FIG. 37 illustrates a completed MEMS device 400 according to an embodiment. The MEMS device 400 includes two low pressure cavities 226 and 228, three medium pressure cavities 322A, 322B, and 322C, and an ambient pressure cavity 402. The MEMS device 400 includes a pressure sensor 404, a motion sensor or accelerometer 406, and gyroscope or resonator 408. The pressure sensor includes a membrane (i.e. region 134 of the polysilicon layer 114) exposed to ambient pressure on one surface (cavity 402) and a low pressure on the other surface (low pressure cavity 226). The motion sensor or accelerometer 406 is in the medium pressure cavity 322B and may detect motion through the displacement of the movable MEMS structure 208 between the polysilicon layers 114 and 222. The gyroscope or resonator 408 is in a low pressure cavity 228 and may detect motion and/or orientation through the disposition of the movable element 210 between the polysilicon layers 114 and 222. Thus, using the formation steps illustrated in FIGS. 1 through 37, a low pressure cavity, a medium pressure cavity, and an ambient pressure cavity may be formed in a MEMS device using the same MEMS manufacturing process.

Figure 38:
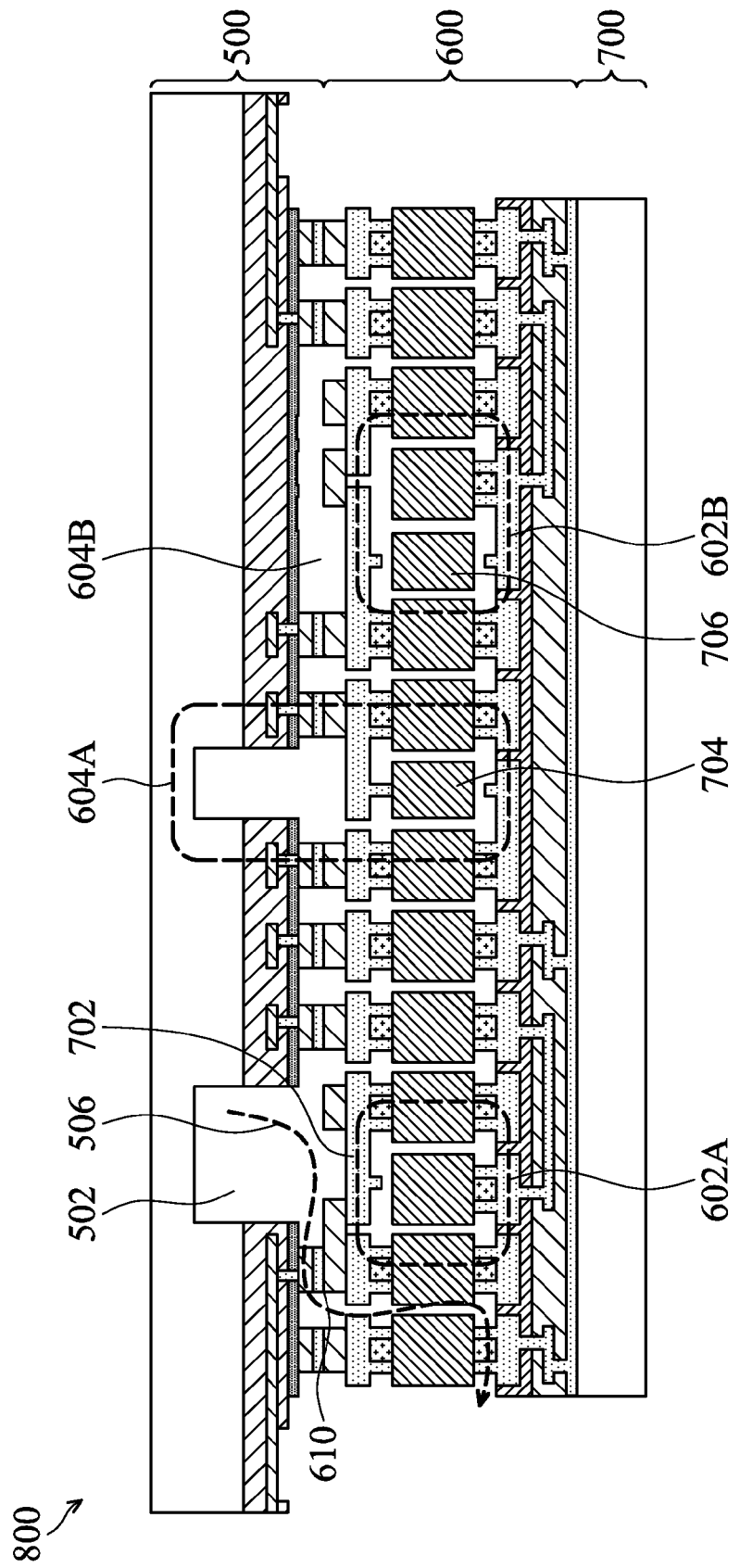
FIG. 38 illustrates a cross-sectional view of a MEMS device according to an embodiment.

FIG. 38 illustrates a MEMS device 800 according to an embodiment wherein the MEMS device 800 includes an ambient pressure cavity 502 with a leak path 506 to the open air environment. The MEMS device 800 includes a cap wafer 500, a MEMS wafer 600, and a carrier wafer 700. Details regarding this embodiment that are similar to those for the previously described embodiment will not be repeated herein.

The MEMS device 800 includes two low pressure cavities 602A and 602B which include one side of a pressure sensor 702 and a gyro or resonator 706, respectively. The MEMS device 800 includes medium pressure cavities 604A and 604B including a motion sensor or accelerometer 704. The MEMS device 800 further includes the ambient pressure cavity 502 which includes the other side of pressure sensor 702. The leak path 506 allows the cavity 502 to be at ambient pressure. The leak path 506 may be established around a bond 610, for example bond 610 may have a trench below it or bond 610 may have a gap in it, to expose the cavity 502 to ambient pressure. The leak path 506 functions similar to cavity 402 in MEMS device 400. Thus, a low pressure cavity, a medium pressure cavity, and an ambient pressure cavity may be formed in a MEMS device using the same MEMS manufacturing process.

An embodiment is a method for forming a microelectromechanical system (MEMS) device, the method including forming a MEMS wafer having a first cavity, the first cavity having a first pressure, and bonding a carrier wafer to a first side of the MEMS wafer, the bonding forming a second cavity, the second cavity having a second pressure, the second pressure being greater than the first pressure. The method further includes bonding a cap wafer to a second side of the MEMS wafer, the second side being opposite the first side, the bonding forming a third cavity, the third cavity having a third pressure, the third pressure being greater than the first pressure and less than the second pressure.

Another embodiment is a method for forming a MEMS device, the method including forming a MEMS wafer including forming a first dielectric layer on a first side of a first substrate, forming a first polysilicon layer over the first dielectric layer, forming a bonding layer over the first polysilicon layer, and exposing a first portion of the first polysilicon layer by removing a portion of the bonding layer. The method further includes bonding a carrier wafer to the MEMS wafer using the bonding layer, the carrier wafer having an opening aligned with the first portion of the first polysilicon layer, the opening and the removed portion of the bonding layer forming a first cavity, patterning the first substrate, the patterning exposing portion of the first dielectric layer, forming a second dielectric layer on a second side of the first substrate, the second side being opposite the first side, forming a second polysilicon layer over the second dielectric layer, and patterning the second polysilicon layer to expose portions of the second dielectric layer. The method further includes removing portions of the first and second dielectric layers to form a second cavity, forming a first plurality of conductive bonds on the second polysilicon layer, at least one of the first plurality of conductive bonds sealing the second cavity, forming a second plurality of conductive bonds to a cap wafer, bonding the cap wafer to the MEMS wafer by bonding the second plurality of conductive bonds to the first plurality of conductive bonds, the bonding forming a third cavity, and thinning a backside of the carrier wafer, the thinning exposing a portion of the opening in the carrier wafer.

A further embodiment is a MEMS device including a MEMS wafer including at least one MEMS structure, a first cavity in the MEMS wafer, the first cavity having a first pressure, a cap wafer bonded to a first side of the MEMS wafer, and a second cavity between the MEMS wafer and the cap wafer, the second cavity having a second pressure, the second pressure being greater than the first pressure. The MEMS device further includes a carrier wafer bonded to a second side of the MEMS wafer, the second side being opposite the first side, and a third cavity between the carrier wafer and the MEMS wafer, the third cavity having a third pressure, the third pressure being greater than the second pressure.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for forming a microelectromechanical system (MEMS) device, the method comprising:
   forming a MEMS wafer having a first cavity;
   bonding a carrier wafer to a first side of the MEMS wafer, the bonding forming a second cavity, the second cavity having a second pressure, the second pressure being an ambient pressure;
   sealing the first cavity, wherein after the sealing the first cavity, the first cavity has a first pressure, the first pressure being less than the second pressure; and
   bonding a cap wafer to a second side of the MEMS wafer, the second side being opposite the first side, the bonding forming a third cavity, the third cavity having a third pressure, the third pressure being greater than the first pressure and less than the second pressure.

2. The method of claim 1, wherein the second pressure is about 1 atmosphere and the third pressure is from about 0.1 mbar to about 500 mbar.

3. The method of claim 1, wherein the forming the MEMS wafer further comprises forming a fourth cavity having a fourth pressure, the fourth cavity laterally spaced from the first cavity.

4. The method of claim 3, wherein the first pressure and the fourth pressure are a same pressure.

5. The method of claim 3, wherein the first cavity and the second cavity comprise a pressure sensor, the third cavity comprises a motion sensor, and the fourth cavity comprises a gyroscope.

6. The method of claim 1, wherein the sealing the first cavity further comprises forming a conductive bond to seal the first cavity, the first pressure of the first cavity being defined by the process used to form the conductive bond.

7. A method for forming a microelectromechanical system (MEMS) device, the method comprising:
   forming a MEMS wafer comprising:
      forming a first dielectric layer on a first side of a first substrate;
      forming a first polysilicon layer over the first dielectric layer;
      forming a bonding layer over the first polysilicon layer; and
      exposing a first portion of the first polysilicon layer by removing a portion of the bonding layer;
   bonding a carrier wafer to the MEMS wafer using the bonding layer, the carrier wafer having an opening aligned with the first portion of the first polysilicon layer, the opening and the removed portion of the bonding layer forming a first cavity;
   patterning the first substrate, the patterning exposing portion of the first dielectric layer;
   forming a second dielectric layer on a second side of the first substrate, the second side being opposite the first side;
   forming a second polysilicon layer over the second dielectric layer;
   patterning the second polysilicon layer to expose portions of the second dielectric layer;
   removing portions of the first and second dielectric layers to form a second cavity;
   forming a first plurality of conductive bonds on the second polysilicon layer, at least one of the first plurality of conductive bonds sealing the second cavity;
   forming a second plurality of conductive bonds to a cap wafer;
   bonding the cap wafer to the MEMS wafer by bonding the second plurality of conductive bonds to the first plurality of conductive bonds, the bonding forming a third cavity; and
   thinning a backside of the carrier wafer, the thinning exposing a portion of the opening in the carrier wafer.

8. The method of claim 7, wherein the first cavity has a first pressure, the second cavity has a second pressure, the second pressure being less than the first pressure, the third cavity having a third pressure, the third pressure being greater than the second pressure and less than the first pressure.

9. The method of claim 7, wherein the removing portions of the first and second dielectric layers forms a fourth cavity laterally adjacent the second cavity, and wherein at least one of the first plurality of conductive bonds seals the fourth cavity.

10. The method of claim 9, wherein the second cavity and the fourth cavity have a same pressure.

11. The method of claim 9, wherein the third cavity is laterally between the second cavity and the fourth cavity.

12. The method of claim 9, wherein the first cavity and the second cavity comprises a pressure sensor, the third cavity comprises a motion sensor, and the fourth cavity comprises a gyroscope.

13. The method of claim 7, wherein forming the first plurality of conductive bonds on the second polysilicon layer comprises a sputtering process, the pressure level of the second cavity being defined by the sputtering process.

14. A method comprising:
   forming a microelectromechanical system (MEMS) wafer having a first cavity and a second cavity, the first cavity having a first pressure and the second cavity having a second pressure;
   bonding a carrier wafer to a first side of the MEMS wafer, the bonding forming a third cavity, the third cavity having a third pressure, the third pressure being greater than the first pressure and the second pressure; and
   bonding a cap wafer to a second side of the MEMS wafer, the second side being opposite the first side, the bonding forming a fourth cavity, the fourth cavity having a fourth pressure, the fourth pressure being greater than the first pressure and the second pressure and less than the third pressure.

15. The method of claim 14, wherein the third pressure is about 1 atmosphere and the fourth pressure is from about 0.1 mbar to about 500 mbar.

16. The method claim 14, wherein the first pressure and the second pressure are a same pressure.

17. The method of claim 14, wherein the first cavity and the third cavity comprise a pressure sensor, the second cavity comprises a gyroscope, and the fourth cavity comprises a motion sensor.

18. The method of claim 14, wherein the fourth cavity is between the first cavity and the second cavity.

19. The method of claim 14, wherein the third cavity comprises an opening extending through the carrier wafer.

20. The method of claim 14, wherein the fourth cavity comprises a recess in the cap wafer.

21. The method of claim 14 further comprising:
   sealing the first cavity and the second cavity, wherein after the sealing the first cavity and the second cavity, the first cavity has the first pressure and the second cavity has the second pressure.

* * * * *